United States Patent
Guo et al.

(10) Patent No.: US 11,302,281 B2
(45) Date of Patent: Apr. 12, 2022

(54) REGISTER VALUE TRANSMISSION METHOD AND TRANSMITTER, DISPLAY DEVICE AND COMPUTER READABLE STORAGE MEDIUM

(71) Applicants: BEIJING BOE DISPLAY TECHNOLOGY CO., LTD., Beijing (CN); BOE TECHNOLOGY GROUP CO., LTD., Beijing (CN)

(72) Inventors: Jun Guo, Beijing (CN); Xin Duan, Beijing (CN); Jieqiong Wang, Beijing (CN); Ming Chen, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 184 days.

(21) Appl. No.: 16/618,494

(22) PCT Filed: Jun. 4, 2018

(86) PCT No.: PCT/CN2018/089739
§ 371 (c)(1),
(2) Date: Dec. 2, 2019

(87) PCT Pub. No.: WO2018/223912
PCT Pub. Date: Dec. 13, 2018

(65) Prior Publication Data
US 2020/0126507 A1  Apr. 23, 2020

(30) Foreign Application Priority Data
Jun. 9, 2017 (CN) .......................... 201710454362.1

(51) Int. Cl.
*G09G 5/00* (2006.01)

(52) U.S. Cl.
CPC ..... *G09G 5/006* (2013.01); *G09G 2310/0286* (2013.01); *G09G 2320/0673* (2013.01);
(Continued)

(58) Field of Classification Search
CPC ........... G09G 5/006; G09G 2310/0286; G09G 2320/0673; G09G 2370/045; G09G 2370/08; G09G 2370/20
See application file for complete search history.

(56) References Cited

U.S. PATENT DOCUMENTS

| 2004/0012551 A1 | 1/2004 | Ishii |
| 2007/0171161 A1 | 7/2007 | Lin |

(Continued)

FOREIGN PATENT DOCUMENTS

| CN | 1707595 A | 12/2005 |
| CN | 1728721 A | 2/2006 |

(Continued)

OTHER PUBLICATIONS

Wiki ("8b/10b encoding", 2016, https://en.wikipedia.org/wiki/8b/10b_encoding) (Year: 2016).*

(Continued)

*Primary Examiner* — Xin Sheng
(74) *Attorney, Agent, or Firm* — Myers Bigel, P.A.

(57) ABSTRACT

Disclosed are a register value transmission method and transmitter, and a display device. The method may be used for a timing controller, and the method includes receiving a user triggered information setting directive including n register values for instructing a source driver to set configuration information of the source driver according to the n register values, n being greater than 1, generating an information setting instruction including the n register values according to the information setting directive, and sending the information setting instruction to the source driver. The (Continued)

disclosure solves the problem of low flexibility of matching the number of register values at both a receiving end and a sending end, and improves the flexibility of matching the number of register values.

17 Claims, 5 Drawing Sheets

(52) U.S. Cl.
CPC ... *G09G 2370/045* (2013.01); *G09G 2370/08* (2013.01); *G09G 2370/20* (2013.01)

(56) References Cited

U.S. PATENT DOCUMENTS

| | | | | |
|---|---|---|---|---|
| 2008/0074378 | A1* | 3/2008 | Chuang | G09G 3/3611 345/98 |
| 2012/0242628 | A1 | 9/2012 | Yuan et al. | |
| 2012/0249618 | A1 | 10/2012 | Sugiyama et al. | |
| 2013/0038367 | A1 | 2/2013 | Yen | |
| 2013/0113777 | A1* | 5/2013 | Baek | G09G 3/20 345/212 |
| 2014/0049525 | A1* | 2/2014 | Lin | G06F 3/14 345/204 |
| 2014/0104249 | A1 | 4/2014 | Furihata et al. | |
| 2014/0118235 | A1 | 5/2014 | Hong et al. | |
| 2014/0168569 | A1 | 6/2014 | Ha | |
| 2014/0298065 | A1 | 10/2014 | Sakamaki | |
| 2014/0313115 | A1 | 10/2014 | Saito et al. | |
| 2018/0151107 | A1* | 5/2018 | Yabuki | G09G 3/2096 |
| 2018/0204494 | A1 | 7/2018 | Shang et al. | |

FOREIGN PATENT DOCUMENTS

| | | |
|---|---|---|
| CN | 101004902 A | 7/2007 |
| CN | 102568404 A | 7/2012 |
| CN | 102739585 A | 10/2012 |
| CN | 102930836 A | 2/2013 |
| CN | 103544928 A | 1/2014 |
| CN | 103794184 A | 5/2014 |
| CN | 103871372 A | 6/2014 |
| CN | 104103248 A | 10/2014 |
| CN | 104103249 A | 10/2014 |
| CN | 104700807 A | 6/2015 |
| CN | 105679268 A | 6/2016 |
| CN | 105702194 A | 6/2016 |

OTHER PUBLICATIONS

"First Office Action and English language translation", CN Application No. 201710454362.1, dated Jan. 18, 2021, 19 pp.

International Search Report and Written Opinion of the International Searching Authority with English language translation, PCT/CN2018/089739, dated Jul. 31, 2018, 15 pp.

* cited by examiner

11,302,281 B2

REGISTER VALUE TRANSMISSION METHOD AND TRANSMITTER, DISPLAY DEVICE AND COMPUTER READABLE STORAGE MEDIUM

CROSS REFERENCE TO RELATED APPLICATIONS

The present application is a 35 U.S.C. 371 national stage application of PCT International Application No. PCT/CN2018/089739, filed on Jun. 4, 2018, which claims the benefit of Chinese Patent Application No. 201710454362.1, filed on Jun. 9, 2017, the entire disclosures of which are incorporated herein by reference.

TECHNICAL FIELD

The disclosure relates to the field of display manufacturing, and in particular, to a register value transmission method and a transmitter, a display device and a computer readable storage medium.

BACKGROUND

A point-to-point (P2P for short) interface is a high speed serial interface applied between a timing controller (T-CON for short) and a source driver (SD for short) inside a display panel of a display. Transmission of display data may be accomplished through the P2P interface. In a procedure of data transmission, it is necessary to transmit some register values for setting some configuration information, for example, setting the number of channels of a port of the source driver, etc.

In the related art, there is a register value transmission method in which the timing controller (i.e., a sending end) sends a fixed number of register values (e.g., register values of 5 bytes) to the source driver (i.e., a receiving end) each time, and the source driver sets the configuration information according to the fixed number of register values.

SUMMARY

The disclosure provides a register value transmission method, a register value transmitter, a display device and a computer readable storage medium.

According to an aspect of the disclosure, there is provided a register value transmission method for a timing controller, the method including:

receiving a triggered information setting directive in which n register values are included, the n register values being used for instructing a source driver to set configuration information of the source driver according to the n register values, and n being greater than 1;

generating an information setting instruction including the n register values according to the information setting directive; and sending the information setting instruction to the source driver.

In an embodiment, the generating an information setting instruction including the n register values according to the information setting directive includes:

generating an initial instruction including the n register values according to the information setting directive; and encoding the initial instruction adopting an 8b/10b encoding approach to obtain the information setting instruction.

In an embodiment, the initial instruction further includes data bits and/or transmission identification, the data bits carry display data or link stability check data, the link stability check data is data for detecting a data transmission state of a link between the timing controller and the source driver, and the transmission identification is used for indicating transmission of the n register values. In a specific implementation, the data bits and/or the transmission identification may be located ahead of the n register values.

In an embodiment, the n register values may include a first register value which may be used for indicating at least one of channel number of a port, scrambling function enabled, matching resistance and transmission rate.

In an embodiment, the n register values may further include a second register value, and the first register value may include data for indicating whether the second register value represents a Gamma voltage value to be adjusted.

In an embodiment, the n register values may further include a third register value, and the first register value may include data for indicating a number of bytes in the register value for representing user customized configuration data in the third register value.

In an embodiment, the n register values may further include a fourth register value, and the first register value may include data for indicating whether the fourth register value represents a user defined register value and a mode of the user defined register value.

In an embodiment, the first register value may include a register value of 11 bytes.

In an embodiment, the second register value may include a register value of 18 consecutive bytes, and the register value of 11 bytes includes binary data of 1 bit for indicating whether the register value of 18 consecutive bytes represents a Gamma voltage value to be adjusted.

In an embodiment, the third register value may include a register value of 15 consecutive bytes, and the register value of 11 bytes includes binary data of 4 consecutive bits for indicating a number of bytes of the register value for representing user customized configuration data in the register value of 15 consecutive bytes.

In an embodiment, the fourth register value may include a register value of 16 consecutive bytes, and the register value of 11 bytes includes binary data of 2 consecutive bits for indicating whether the register value of 16 consecutive bytes represents a user defined register value and a mode of the user defined register value.

In an embodiment, the transmission identification is a K4 code of 4 bytes.

According to a second aspect of the disclosure, there is provided a register value transmission method for a source driver, the method including:

receiving an information setting instruction sent by a timing controller, the information setting instruction including n register values, the information setting instruction being generated by the timing controller according to a triggered information setting directive including the n register values, and n being greater than 1; and setting configuration information of the source driver according to the n register values.

In an embodiment, the step of setting configuration information of the source driver according to the n register values includes:

decoding the information setting instruction adopting an 8b/10b decoding approach to obtain an initial instruction including the n register values; and setting the configuration information of the source driver according to the n register values in the initial instruction.

In an embodiment, the initial instruction further includes data bits and/or transmission identification, the data bits carry display data or link stability check data, the link stability check data is data for detecting a data transmission state of a link between the timing controller and the source driver, and the transmission identification is used for indicating transmission of the n register values. In a specific implementation, the data bits and/or the transmission identification may be located ahead of the n register values.

In an embodiment, the step of setting configuration information of the source driver according to the n register values includes: setting at least one of the following: channel number of a port, scrambling function enabled, matching resistance, transmission rate, Gamma voltage value, user customized configuration data, user defined register value and mode of user defined register value.

In an embodiment, the n register values may include a first register value of 11 bytes, and the first register value of 11 bytes may include binary data of 2 consecutive bits for indicating a channel number of a port. The step of setting configuration information of the source driver according to the n register values may include:

setting the channel number of the port of the source driver to x1 when the binary data of 2 consecutive bits is 00;

setting the channel number of the port of the source driver to x2 when the binary data of 2 consecutive bits is 01; and setting the channel number of the port of the source driver to x3 when the binary data of 2 consecutive bits is 10 or 11, x1, x2 and x3 being mutually different.

In an embodiment, the first register value of 11 bytes may further include binary data of 1 bit for indicating scrambling function enabled. The step of setting configuration information of the source driver according to the n register values may include:

disabling the scrambling function when the binary data of 1 bit is 0; and enabling the scrambling function when the binary data of 1 bit is 1.

In an embodiment, the first register value of 11 bytes may further include binary data of 3 consecutive bits for indicating matching resistance. The step of setting configuration information of the source driver according to the n register values may include:

setting the matching resistance of the source driver to y1 Ohms when the binary data of 3 consecutive bits is 000;

setting the matching resistance of the source driver to y2 Ohms when the binary data of 3 consecutive bits is 001;

setting the matching resistance of the source driver to y3 Ohms when the binary data of 3 consecutive bits is 010;

setting the matching resistance of the source driver to y4 Ohms when the binary data of 3 consecutive bits is 011;

setting the matching resistance of the source driver to y5 Ohms when the binary data of 3 consecutive bits is 100; and setting the matching resistance of the source driver to y6 Ohms when the binary data of 3 consecutive bits is 101, y1, y2, y3, y4, y5 and y6 being mutually different.

In an embodiment, the first register value of 11 bytes may further include binary data of 5 consecutive bits for indicating a transmission rate. The step of setting configuration information of the source driver according to the n register values may include:

setting the transmission rate of the source driver to 540 Mbps when the binary data of 5 consecutive bits is 00000, and increasing the transmission rate of the source driver by 108 Mbps when 00000 increases by a binary 1 of 1 bit.

In an embodiment, the n register values further include a second register value of 18 consecutive bytes in addition to the first register value, and the first register value may include binary data of 1 bit for indicating whether the second register value of 18 consecutive bytes represents a Gamma voltage value to be adjusted. The step of setting configuration information of the source driver according to the n register values may include:

determining that the register value of 18 consecutive bytes does not represent a Gamma voltage value to be adjusted when the binary data of 1 bit in the first register value is 0; and determining that the register value of 18 consecutive bytes represents a Gamma voltage value to be adjusted when the binary data of 1 bit in the first register value is 1, and adjusting the Gamma voltage according to the Gamma voltage value represented by the register value of 18 consecutive bytes.

In an embodiment, the n register values further include a third register value of 15 consecutive bytes in addition to the first register value, and the first register value may include binary data of 4 consecutive bits for indicating a number of bytes in the register value for representing user customized configuration data in the third register value of 15 consecutive bytes. The step of setting configuration information of the source driver according to the n register values may include:

determining the number of bytes of the register value for representing user customized configuration data in the third register value of 15 consecutive bytes according to the binary data of 4 consecutive bits;

obtaining the user customized configuration data from the third register value of 15 consecutive bytes according to the determined number of bytes; and setting the configuration information of the source driver according to the obtained user customized configuration data.

In an embodiment, the n register values further include a fourth register value of 16 consecutive bytes, and the first register value may include binary data of 2 consecutive bits for indicating whether the fourth register value of 16 consecutive bytes represents a user defined register value and a mode of the user defined register value. The step of setting configuration information of the source driver according to the n register values may include:

determining that the fourth register value of 16 consecutive bytes does not represent a user defined register value when the binary data of 2 consecutive bits is 00; and determining that the fourth register value of 16 consecutive bytes represents a user defined register value when the binary data of 2 consecutive bits is 01, 10 or 11, and determining a mode of the user defined register value according to the binary data of 2 consecutive bits, and setting the configuration information of the source driver according to the determined mode.

In an embodiment, the step of setting configuration information of the source driver according to the n register values includes: setting at least one of the following: channel number of a port, scrambling function enabled, matching resistance, transmission rate, Gamma voltage value, user customized configuration data, user defined register value and mode of user defined register value.

According to a third aspect of the disclosure, there is provided a register value transmitter for a timing controller, which register value transmitter may include:

a receiver which may be configured for receiving a triggered information setting directive in which n register values are included, the n register values being used for instructing a source driver to set configuration information of the source driver according to the n register values, and n being greater than 1;

a generator which may be configured for generating an information setting instruction including the n register values according to the information setting directive; and a sender which may be configured for sending the information setting instruction to the source driver.

According to a fourth aspect of the disclosure, there is provided a register value transmitter for a source driver, which register value transmitter may include:

a receiver which may be configured for receiving an information setting instruction sent by a timing controller, the information setting instruction including n register values, the information setting instruction being generated by the timing controller according to a triggered information setting directive including the n register values, and n being greater than 1; and a setter which may be configured for setting configuration information of the source driver according to the n register values.

In an embodiment, the setter may be configured for:

decoding the information setting instruction adopting an 8b/10b decoding approach to obtain an initial instruction including the n register values; and setting the configuration information of the source driver according to the n register values in the initial instruction.

According to a fifth aspect of the disclosure, there is provided a display device including a register value transmitter for a timing controller as described above and a register value transmitter for a source driver as described above.

According to a sixth aspect of the disclosure, there is provided a computer readable storage medium storing instructions therein which, when executed by a processor, causes the processor to perform any of the register value transmission methods as described above.

This Summary introduces some concepts of the disclosure in a simplified form that are further described below in the Detailed Description. This Summary is not intended to give necessary features or essential features of the claimed subject matter, nor is it intended to limit the scope of the claimed subject matter. In addition, as described herein, various other features and advantages may also be incorporated into the techniques as needed.

BRIEF DESCRIPTION OF THE DRAWINGS

In order to more clearly illustrate the technical solutions of some embodiments of the disclosure, the disclosure provides the following appended drawings to be used in the description of the embodiments. It should be appreciated that, the drawings in the following description only relate to some embodiments, and for the person having ordinary skills in the art, other drawings may also be obtained according to these drawings under the premise of not paying out undue experimentation, which other drawings also fall within the scope of the invention.

DETAILED DESCRIPTION

To be able to more clearly understand the objects, technical solutions and advantages of some embodiments, in the following, the embodiments will be further described in detail in conjunction with the drawings.

Figure 1:
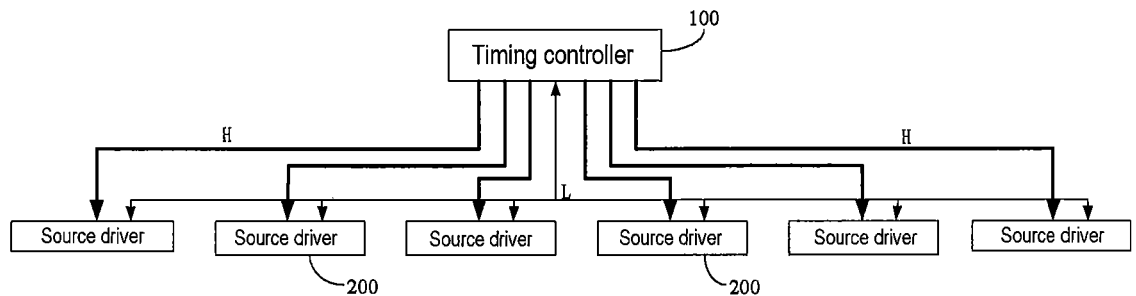
FIG. 1 is a schematic diagram of an application environment of a register value transmission method provided according to an embodiment of the disclosure.

FIG. 1 shows a schematic diagram of an application environment of a register value transmission method provided according to an embodiment of the disclosure. As shown in FIG. 1, the register value transmission method may be applied in a display device, which may include a timing controller 100 and a plurality of source drivers 200. A plurality of high speed signal lines H of the timing controller 100 are coupled to the plurality of source drivers 200 in a one to one correspondence. The timing controller 100 is also coupled to a low speed signal line L, and the plurality of source drivers 200 are connected in parallel and coupled to the low speed signal line L. A P2P interface is a high speed serial interface between the timing controller 100 and a source driver 200, and transmission of display data may be accomplished by the P2P interface. In a procedure of data transmission, it is necessary to transmit some register values for setting some configuration information. In the related art, the timing controller 100 (i.e., a sending end) sends a fixed number of register values to the source driver 200 (i.e., a receiving end) each time, and the source driver 200 sets the configuration information according to the fixed number of register values. In the procedure, when the number of valid register values required by the timing controller is greater than that required by the source driver, the source driver will ignore part of received register values sent by the timing controller, whereas when the number of valid register values required by the timing controller is less than that required by the source driver, it is necessary to complement the register values received by the source driver and sent by the timing controller through a peripheral circuit. The overall procedure is complex, the flexibility of matching the number of register values at both the receiving end and the sending end is low, and it may further be possible to result in waste of register values.

However, in some embodiments provided by the disclosure, the timing controller will generate a corresponding number of register values according to a triggered information setting directive each time, there is no need for the source driver to ignore part of the register values sent by the timing controller, and it is also unnecessary to compensate for the register values sent by the timing controller through a peripheral circuit.

Figure 2:
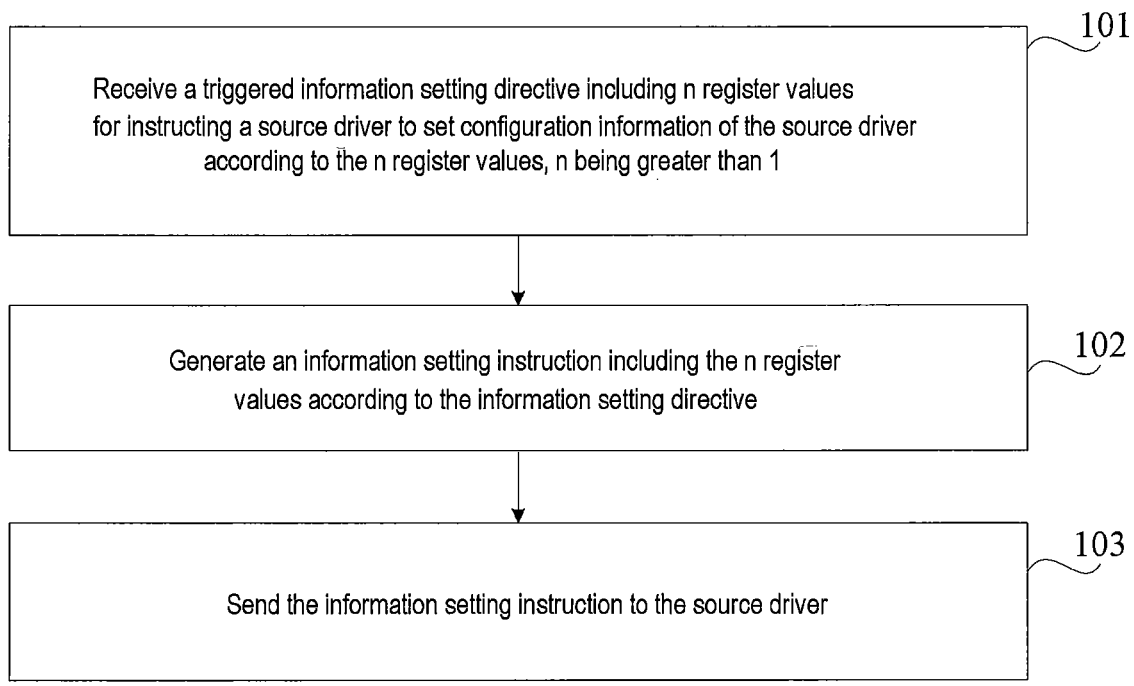
FIG. 2 is a flow chart of a register value transmission method provided according to an embodiment of the disclosure.

FIG. 2 illustrates a register value transmission method provided according to an embodiment of the disclosure, which method may be used for the timing controller 100 in the application environment as shown in FIG. 1. As shown in FIG. 2, the method may include the following steps.

At step 101, a triggered information setting directive is received, in which n register values are included, the n register values being used for instructing a source driver to set configuration information of the source driver according to the n register values, and n being greater than 1.

The source driver may be any of the source drivers in the application environment as shown in FIG. 1.

At step 102, an information setting instruction including the n register values is generated according to the information setting directive.

At step 103, the information setting instruction is sent to the source driver.

In the register value transmission method, since the timing controller will generate an information setting instruction including a corresponding number of register values according to a triggered information setting directive and send the information setting instruction to the source driver each time, the source driver may set the configuration information according to the information setting instruction, and as compared to the related art, there is no need for the source driver to ignore part of the register values sent by the timing controller, and it is also unnecessary to compensate for the register values sent by the timing controller through a peripheral circuit, this simplifies the procedure of register value transmission, and increases the flexibility of matching the number of register values at both the receiving end and the sending end.

Figure 3:
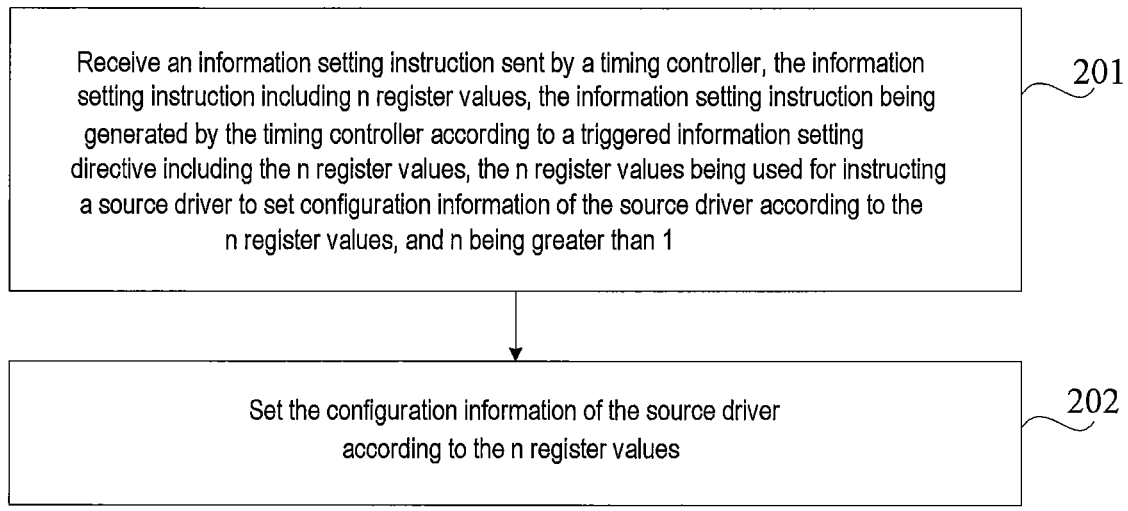
FIG. 3 is a flow chart of another register value transmission method provided according to an embodiment of the disclosure.

FIG. 3 illustrates another register value transmission method provided according to an embodiment of the disclosure, which method may be used for any of the source drivers 200 in the application environment as shown in FIG. 1. As shown in FIG. 3, the method may include:

step 201, receiving an information setting instruction sent by a timing controller, the information setting instruction including n register values, the information setting instruction being generated by the timing controller according to a triggered information setting directive including the n register values, the n register values being used for instructing a source driver to set configuration information of the source driver according to the n register values, and n being greater than 1; and step 202, setting the configuration information of the source driver according to the n register values.

In the register value transmission method described above, the source driver receives an information setting instruction sent by the timing controller, and sets configuration information of the source driver according to n register values, wherein the information setting instruction includes the n register values, the information setting instruction is generated by the timing controller according to a triggered information setting directive including the n register values, the n register values are used for instructing the source driver to set configuration information of the source driver according to the n register values, so there is no need for the source driver to ignore part of the register values sent by the timing controller, it is also unnecessary to compensate for the register values sent by the timing controller through a peripheral circuit, and this simplifies the procedure of register value transmission, and increases the flexibility of matching the number of register values at both the receiving end and the sending end.

Figure 4A:
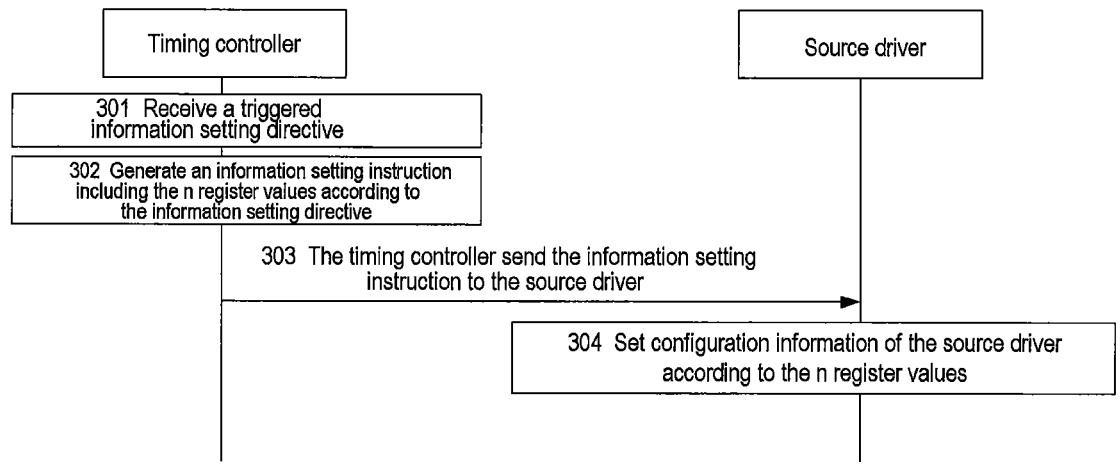
FIG. 4A is a flow chart of still another register value transmission method provided according to an embodiment of the disclosure.

FIG. 4A illustrates still another register value transmission method provided according to an embodiment of the disclosure, which method may be used for the application environment as shown in FIG. 1. As shown in FIG. 4A, the method may include the following steps.

At step 301, a timing controller receives a triggered information setting directive.

In the information setting directive are included n register values, the n register values are used for instructing a source driver to set configuration information of the source driver according to the n register values, and n is greater than 1. The source driver may be any of the source drivers in the application environment as shown in FIG. 1.

For example, the n register values may be used for instructing the source driver to set a channel number of a port of the source driver according to the n register values, or may also be used for instructing the source driver to enable the scrambling function according to the n register values, or may also be used for instructing the source driver to set the matching resistance of the source driver according to the n register values, or may further be used for instructing the source driver to set a transmission rate of the source driver according to the n register values, or may further be used for instructing the source driver to set other configuration information of the source driver according to the n register values, for example, adjust the Gamma voltage, or the like. It may also be possible to set multiple pieces of configuration information simultaneously, and the content of the configuration information to be set will not be limited by the embodiments provided by the disclosure.

At step 302, the timing controller generates an information setting instruction including the n register values according to the information setting directive.

Figure 4B:
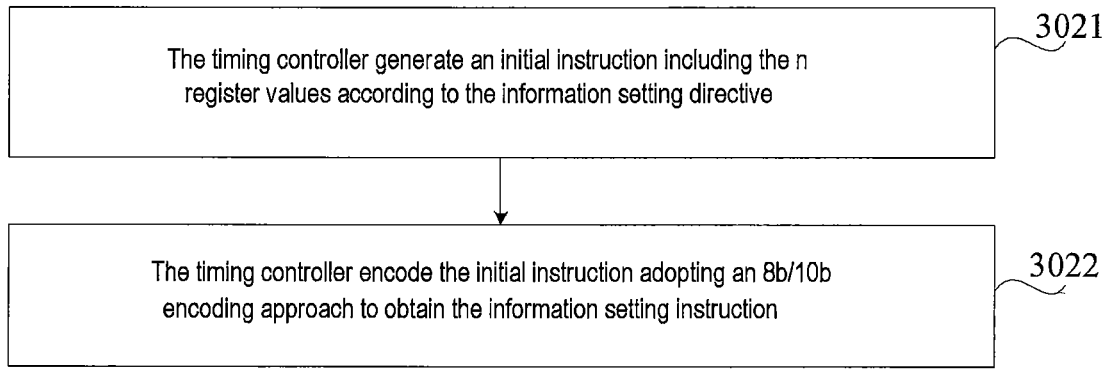
FIG. 4B is a flow chart of generating an information setting instruction provided according to an embodiment of the disclosure.

In an embodiment, as shown in FIG. 4B, the step 302 may include the following steps.

At step 3021, the timing controller generates an initial instruction including the n register values according to the information setting directive.

For example, the n register values may include register values of 11-60 bytes. The number of bytes of the register values will not be limited by the disclosure.

Further, the initial instruction may further include data bits and/or transmission identification. In a specific implementation, the data bits and/or transmission identification may be located ahead of the n register values. The data bits carry display data or link stability check data, wherein the link stability check data is data for detecting a data transmission state of a link between the timing controller and the source driver. The source driver receives link stability check data sent by the timing controller after clock calibration, and when the link stability check data received by the source driver is correct, it indicates that the data transmission state of the link is good, and at this time, the timing controller sends data to the source driver, and the reliability and stability of data transmission is higher.

The transmission identification may be used for indicating the start of transmission of the n register values. For example, the transmission identification may be a K4 code of 4 bytes.

In an embodiment, the n register values may be located behind the K4 code, and the K4 code may be located at the end of one frame of display data, or may also be located behind the link stability check data for detecting the data transmission state of the link. When receiving the K4 code, the source driver may determine that behind the K4 code are the n register values.

At step 3022, the timing controller may encode the initial instruction adopting an 8b/10b (a technique of encoding 8-bit data into 10-bit data in the related art) encoding approach to obtain the information setting instruction.

When the timing controller encodes valid data in the initial instruction adopting the 8b/10b encoding approach, the valid data is data apart from a special code, such as the transmission identification, etc. In an embodiment, the valid data may include the data that the data bits carry and the n register values.

For example, it may be possible to encode the valid data adopting the 8b/10b encoding approach in the related art. Encoding adopting the 8b/10b encoding approach may be such that the numbers of "0s" and "1s" that are sent keep substantially consistent, consecutive "0s" and "1s" do not exceed 5 bits, that is, one bit of "0" must be inserted behind every 5 consecutive "1s", and one bit of "1" must be inserted behind every 5 consecutive "0s", thereby guaranteeing signal DC (direct current) balance. When encoding the check data adopting the 8b/10b encoding approach in the related art, it may be possible to divide a set of consecutive 8-bit data into two parts, 5b/6b (i.e., encoding 5-bit data into 6-bit data) encoding is performed on the first 5 bits thereof, and 3b/4b (i.e., encoding 3-bit data into 4-bit data) encoding is performed on the last 3 bits thereof.

However, in the data obtained by encoding adopting the 8b/10b encoding approach in the related art, the boundary between every two sets of 10-bit data is blurred, and a transmission error is easy to take place. Therefore, to ensure that data to be transmitted can be correctly recovered at the receiving end, in an embodiment, when encoding the valid data, it may be possible to first encode 8-bit data corresponding to a byte to be encoded of the valid data into 9-bit data, and when the byte to be encoded is not the first byte of the valid data, detect the first bit of data of the 9-bit data and a previous bit of data adjacent to the first bit of data; when the numerical value of the first bit of data is the same as that of the previous bit of data, invert the 9-bit data and then add a tenth bit of data for indicating that the 9-bit data has undergone an inversion operation behind the 9-bit data to obtain 10-bit data; and when the numerical value of the first bit of data is different from that of the previous bit of data, add a tenth bit of data for indicating that the 9-bit data has not undergone an inversion operation behind the 9-bit data to obtain 10-bit data; wherein the 10-bit data is binary data. When the byte to be encoded is the first byte of the valid data, a tenth bit of data for indicating that the 9-bit data has not undergone an inversion operation is added behind the 9-bit data to obtain 10-bit data. In the encoding procedure, the 8-bit data is encoded into 9-bit data first, then a tenth bit of data is added to obtain 10-bit data, a jumping edge is arranged between every two adjacent 10-bit data, and the tenth bit of data is used for indicating whether the 9-bit data has undergone an inversion operation, which can effectively ensure that the data to be transmitted is correctly recovered at the receiving end, and the jumping edge may effectively reduce transmission errors.

At step 303, the timing controller sends the information setting instruction to the source driver.

The timing controller encodes the initial instruction to obtain the information setting instruction, and then sends the information setting instruction to the source driver, in order that the source driver sets configuration information according to the n register values in the information setting instruction, for example, sets the channel number of a port, enables the scrambling function, sets the matching resistance, adjusts the Gamma voltage, and the like.

At step 304, the source driver sets configuration information of the source driver according to the n register values.

Figure 4C:
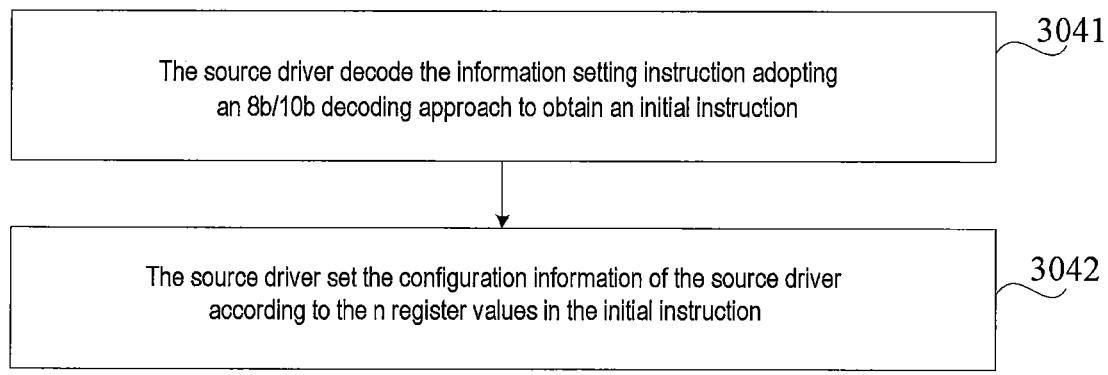
FIG. 4C is a flow chart of setting configuration information provided according to an embodiment of the disclosure.

In an embodiment, as shown in FIG. 4C, the step 304 may include the following steps.

At step 3041, the source driver may decode the information setting instruction adopting an 8b/10b decoding approach to obtain an initial instruction.

The initial instruction includes the n register values.

At the step 3022, the timing controller encodes the initial instruction adopting an 8b/10b encoding approach to obtain the information setting instruction. Therefore, when receiving the information setting instruction sent by the timing controller, the source driver needs to decode the information setting instruction adopting an 8b/10b decoding approach, to obtain the initial instruction before the encoding. The initial instruction obtained by decoding includes the n register values for instructing the source driver to set the configuration information of the source driver.

At step 3042, the source driver sets the configuration information of the source driver according to the n register values in the initial instruction.

For example, the n register values may include a register value of 11 bytes.

For example, the register value of 11 bytes may include data for indicating the channel number of a port. More specifically, the register value of 11 bytes may include binary data of 2 consecutive bits for indicating the channel number of a port. Accordingly, the step 304 may include:

setting the channel number of the port of the source driver to x1 when the binary data of 2 consecutive bits is 00;

setting the channel number of the port of the source driver to x2 when the binary data of 2 consecutive bits is 01; and setting the channel number of the port of the source driver to x3 when the binary data of 2 consecutive bits is 10 or 11, x1, x2 and x3 being mutually different. For example, x1 may be equal to 1, x2 may be equal to 2, x3 may be equal to 3. The values of x1, x2 and x3 will not be limited by the disclosure.

For example, the channel number of the port of the source driver may be indicated by bit[0] and bit[1] in the first byte register value in the register value of 11 bytes. For instance, when bit[0] is 0 and bit[1] is 0, the source driver sets the channel number of the port of the source driver to 1; when bit[0] is 0 and bit[1] is 1, the source driver sets the channel number of the port of the source driver to 2; and when bit[0] is 1, the source driver sets the channel number of the port of the source driver to 3. It is noted that, when the source driver sets the channel number of the port of the source driver to 2 or 3, the data transmitted on each channel is the same.

For example, the register value of 11 bytes may further include data for indicating scrambling function enabled. More specifically, the register value of 11 bytes may include binary data of 1 bit for indicating scrambling function enabled. Accordingly, the step 304 may include:

disabling the scrambling function when the binary data of 1 bit is 0; and enabling the scrambling function when the binary data of 1 bit is 1.

For example, whether the scrambling function is enabled may be indicated by bit[4] in the first byte register value in the register value of 11 bytes. For instance, when bit[4] is 0, the scrambling function is disabled, and when bit[4] is 1, the scrambling function is enabled.

For example, the register value of 11 bytes may further include data for indicating matching resistance. More specifically, the register value of 11 bytes may include binary data of 3 consecutive bits for indicating matching resistance. Accordingly, the step 304 may include:

setting the matching resistance of the source driver to y1 Ohms when the binary data of 3 consecutive bits is 000;

setting the matching resistance of the source driver to y2 Ohms when the binary data of 3 consecutive bits is 001;

setting the matching resistance of the source driver to y3 Ohms when the binary data of 3 consecutive bits is 010;

setting the matching resistance of the source driver to y4 Ohms when the binary data of 3 consecutive bits is 011;

setting the matching resistance of the source driver to y5 Ohms when the binary data of 3 consecutive bits is 100; and setting the matching resistance of the source driver to y6 Ohms when the binary data of 3 consecutive bits is 101, y1, y2, y3, y4, y5 and y6 being mutually different.

For example, y1 may be equal to 100, y2 may be equal to 110, y3 may be equal to 150, y4 may be equal to 170, y5 may be equal to 300, and y6 may be equal to 400. The values of y1, y2, y3, y4, y5 and y6 will not be limited by the disclosure.

For example, the matching resistance of the source driver may be indicated by bit[5]-bit[7] in the first byte register value in the register value of 11 bytes. For instance, when bit[5]-bit[7] is 000, the source driver sets the matching resistance of the source driver to 100 Ohms, when bit[5]-bit[7] is 001, the source driver sets the matching resistance of the source driver to 110 Ohms, and so on.

For example, the register value of 11 bytes may further include data for indicating a transmission rate. More specifically, the register value of 11 bytes may include binary data of 5 consecutive bits for indicating a transmission rate. Accordingly, the step 304 may include:

setting the transmission rate of the source driver to 540 Mbps when the binary data of 5 consecutive bits is 00000, and increasing the transmission rate of the source driver by 108 Mbps when 00000 increases by a binary 1 of 1 bit. In addition, when the binary data of 5 consecutive bits is 00000, the transmission rate of the source driver may also be set to other rates, which will not be limited by the disclosure.

For example, the transmission rate of the source driver may be indicated by bit[0]-bit[4] in the second byte register value in the register value of 11 bytes. For instance, when bit[0]-bit[4] is 00000, the source driver sets the transmission rate of the source driver to 540 Mbps; when bit[0]-bit[4] is 00001, the source driver sets the transmission rate of the source driver to 648 Mbps; when bit[0]-bit[4] is 00010, the source driver sets the transmission rate of the source driver to 756 Mbps; and when bit[0]-bit[4] is 00011, the source driver sets the transmission rate of the source driver to 864 Mbps, and so on.

In an embodiment, the register value of 11 bytes may be used for indicating at least one of channel number of a port, scrambling function enabled, matching resistance and transmission rate.

Further, in addition to including the register value of 11 bytes, the n register values may further include other register values of the same length or different lengths. The register value of 11 bytes may include data for indicating the presence and/or functions of the other register values. For example, the n register values may further include a register value of 18 bytes located behind the register value of 11 bytes. Specifically, the n register values may further include a register value of 18 consecutive bytes in addition to the register value of 11 bytes, and the register value of 11 bytes may include binary data of 1 bit for indicating whether the register value of 18 consecutive bytes represents a Gamma voltage value to be adjusted. Accordingly, the step 304 may include:

determining that the register value of 18 consecutive bytes does not represent a Gamma voltage value to be adjusted when the binary data of 1 bit in the register value of 11 bytes is 0; and determining that the register value of 18 consecutive bytes represents a Gamma voltage value to be adjusted when the binary data of 1 bit in the register value of 11 bytes is 1, and adjusting the Gamma voltage according to the Gamma voltage value represented by the register value of 18 consecutive bytes.

For example, whether the register value of 18 consecutive bytes represents a Gamma voltage value to be adjusted may be indicated by bit[0] in the seventh byte register value in the register value of 11 bytes. For instance, when bit[0] is 0, the source driver determines that the register value of 18 consecutive bytes does not represent a Gamma voltage value to be adjusted, at this time, there is no need for the source driver to adjust the Gamma voltage, and therefore this setting approach is suitable for a situation in which the source driver does not adjust the Gamma voltage; and when bit[0] is 1, the source driver determines that the register value of 18 consecutive bytes represents a Gamma voltage value to be adjusted, and then the source driver adjusts the Gamma voltage according to the represented Gamma voltage value. Possibly, an external integrated circuit (IC for short) is needed to adjust the Gamma voltage.

Further, in addition to the register values of (11+18) bytes, the n register values may further include a register value of 15 bytes located behind the register values of (11+18) bytes. Of course, the n register values may also not include the register value of 18 bytes for indicating the Gamma voltage value, and at this point, behind the register value of 11 bytes is the register value of 15 bytes. In particular, the n register values include a register value of 15 consecutive bytes, and the register value of 11 bytes may include binary data of 4 consecutive bits for indicating a number of bytes of the register value for representing user customized configuration data in the register value of 15 consecutive bytes. Accordingly, the step 304 may include:

determining the number of bytes of the register value for representing user customized configuration data in the register value of 15 consecutive bytes according to the binary data of 4 consecutive bits;

obtaining the user customized configuration data from the register value of 15 consecutive bytes according to the determined number of bytes; and setting the configuration information of the source driver according to the obtained user customized configuration data.

For example, the number of bytes of the register value for representing user customized configuration data in the register value of 15 consecutive bytes may be indicated by bit[3]-bit[0] in the eighth byte register value in the register value of 11 bytes, wherein bit[3] is the most significant bit, and bit[0] is the least significant bit. For instance, when bit[3]-bit[0] is 0110, it means the number of bytes of the register value for representing user customized configuration data in the register value of 15 consecutive bytes is 6, that is, the user uses a register value of 6 bytes to customize configuration data; and when bit[3]-bit[0] is 0111, it means the number of bytes of the register value for representing user customized configuration data in the register value of 15 consecutive bytes is 7. Therefore, the value of bit[3]-bit[0] may indicate that the number of bytes of the register value for representing user customized configuration data in the register value of 15 consecutive bytes is 0-15. After determining the number of bytes of the register value for the user customized configuration data, the source driver may obtain the user customized configuration data from the register value of the corresponding bytes (this register value is also called a user specific register value), and set the configuration information of the source driver. The content of the user customized configuration data will not be limited by the embodiments of the disclosure.

Further, in addition to the register values of (11+18+15) bytes, the n register values may further include a register value of 16 bytes located behind the register values of (11+18+15) bytes. Of course, the n register values may also not include the register value of 18 bytes for indicating the Gamma voltage value and/or the register value of 15 bytes for indicating the user customized configuration data, and at this point, the register value of 11 bytes may be directly followed by the register value of 16 bytes. In particular, the n register values further include a register value of 16 consecutive bytes, and the register value of 11 bytes may include binary data of 2 consecutive bits for indicating whether the register value of 16 consecutive bytes represents a user defined register value and a mode of the user defined register value. Accordingly, the step 304 may include:

determining that the register value of 16 consecutive bytes does not represent a user defined register value when the binary data of 2 consecutive bits is 00; and determining that the register value of 16 consecutive bytes represents a user defined register value when the binary data of 2 consecutive bits is 01, 10 or 11, and determining a mode of the user defined register value according to the binary data of 2 consecutive bits, and then setting the configuration information of the source driver according to the determined mode.

For example, whether the register value of 16 consecutive bytes represents a user defined register value and a mode of the user defined register value (which mode is a use mode of the register value) may be indicated by bit[2] and bit[3] in the ninth byte register value in the register value of 11 bytes. For instance, when bit[2] is 0 and bit[3] is 1, it is determined that the register value of 16 consecutive bytes represents a user defined register value and the corresponding mode is a first mode; when bit[2] is 1 and bit[3] is 0, it is determined that the register value of 16 consecutive bytes represents a user defined register value and the corresponding mode is a second mode; when bit[2] is 1 and bit[3] is 1, it is determined that the register value of 16 consecutive bytes represents a user defined register value and the corresponding mode is a third mode; and bit[2] is 0 and bit[3] is 0, it is determined that the register value of 16 consecutive bytes does not represent a user defined register value. After determining the mode of the user defined register value, the source driver can set the configuration information of the source driver according to the determined mode. The mode of the user defined register value will not be limited by the embodiments of the disclosure.

Figure 4D:
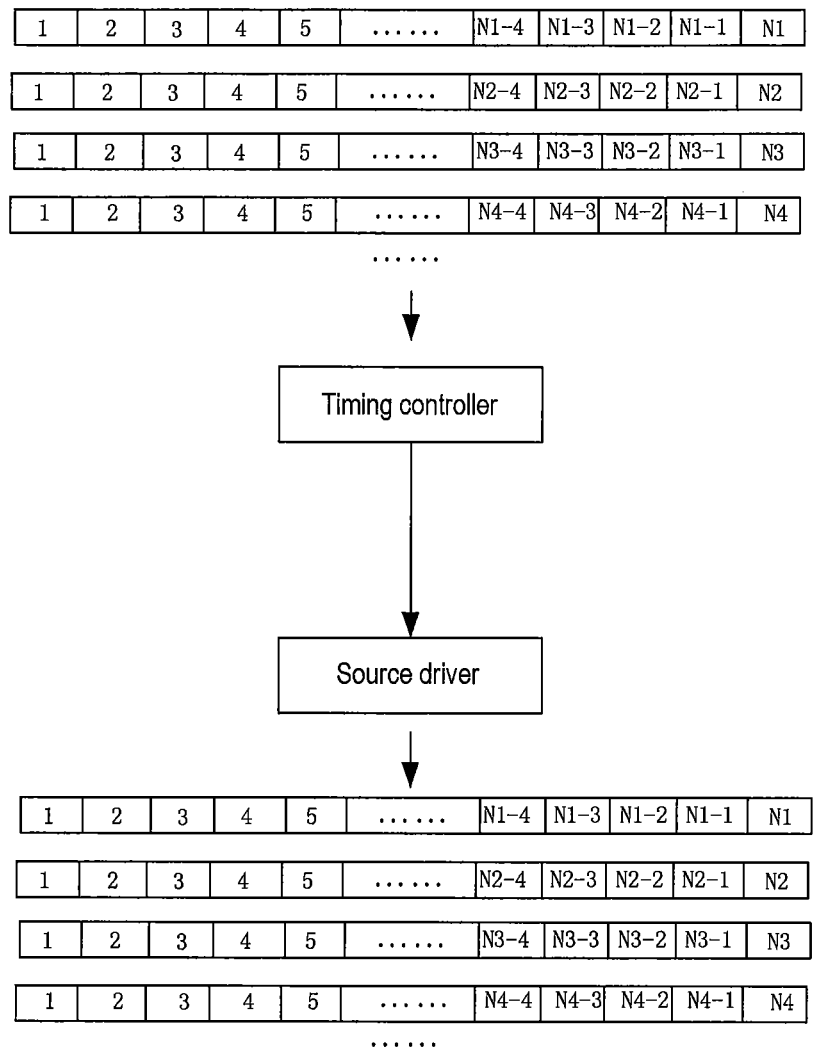
FIG. 4D is a schematic diagram of transmission of register values of different lengths provided according to an embodiment of the disclosure.

FIG. 4D shows a schematic diagram of the timing controller sending register values of different numbers (i.e., different lengths) to the source driver. With reference to FIG. 4D, the timing controller sends a plurality of information setting instructions to the source driver, for example, a first information setting instruction includes N4 register values, a second information setting instruction includes N3 register values, a third information setting instruction includes N2 register values, and a fourth information setting instruction includes N1 register values, wherein N1, N2, N3 and N4 are all different.

The register value transmission method provided by the embodiments of the disclosure is such that a timing controller can send a corresponding number of register values to a source driver according to user needs, and the source driver can flexibly set corresponding configuration information. By this method, the length and the function of a register value may be flexibly adjusted according to actual needs. As compared to the related art, for instance, when the number of valid register values required by the timing controller is greater than that required by the source driver, there is no need for the source driver to ignore part of the received register values sent by the timing controller, which saves the transmission time of the register values, and the saved time may be used for transmitting data for some extended functions, for instance, a parameter for optimizing an OLED panel (e.g., a data compensation parameter and a touch parameter, etc.). The method avoids waste of register values, and reduces power consumption of transmitting data. As another example, when the number of valid register values required by the timing controller is less than that required by the source driver, there is no need for compensating for the register values sent by the timing controller through a peripheral circuit, which improves the effective data occupancy for transmission and increases the utilization of transmission bandwidth.

It needs to be added that, the register value transmission method provided by the embodiments of the disclosure is suitable for a P2P interface protocol, this method is adapted for any product or component with the display function employing the P2P interface protocol, and this method may cause the flexibility of matching the number of register values at both the receiving end and the sending end of a P2P interface to be higher.

It is noted that, the order of the steps of the register value transmission method provided by the embodiments of the disclosure may be appropriately adjusted, and the steps may also be increased or decreased accordingly according to the situation. Variations of the method may easily occur to any skilled person familiar with the technical field within the technical scope disclosed by this application, and should all be encompassed within the protective scope of this application, and therefore will not be repeated any longer.

From the above, for the register value transmission method provided by the embodiments of the disclosure, since a timing controller will generate an information setting instruction including a corresponding number of register values according to a triggered information setting directive and send the information setting instruction to a source driver each time, the source driver may set configuration information according to the information setting instruction, and as compared to the related art, there is no need for the source driver to ignore part of the register values sent by the timing controller, and it is also unnecessary to compensate for the register values sent by the timing controller through a peripheral circuit, this simplifies the procedure of register value transmission, increases the flexibility of matching the number of register values at both the receiving end and the sending end, may save the transmission time of the register values, avoids waste of register values, reduces power consumption of transmitting data, and may increase the utilization of transmission bandwidth.

Figure 5:
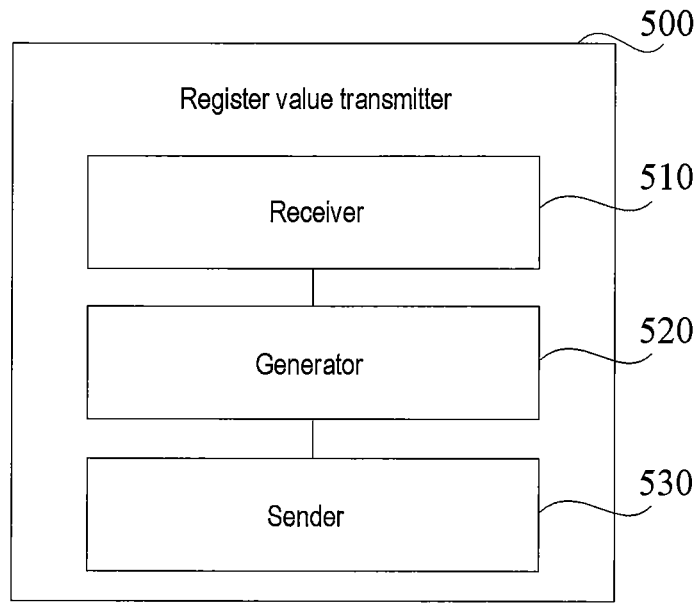
FIG. 5 is a structural schematic diagram of a register value transmitter provided according to an embodiment of the disclosure.

FIG. 5 shows a register value transmitter provided according to an embodiment of the disclosure, which register value transmitter may be used for the timing controller 100 in the application environment as shown in FIG. 1. As shown in FIG. 5, the register value transmitter 500 may include:

a receiver 510 which may be configured for receiving a triggered information setting directive in which n register values are included, the n register values being used for instructing a source driver to set configuration information of the source driver according to the n register values, and n being greater than 1;

a generator 520 which may be configured for generating an information setting instruction including the n register values according to the information setting directive; and a sender 530 which may be configured for sending the information setting instruction to the source driver.

In the above register value transmitter, since the timing controller will generate an information setting instruction including a corresponding number of register values according to a triggered information setting directive and send the information setting instruction to the source driver each time, the source driver may set the configuration information according to the information setting instruction, and as compared to the related art, there is no need for the source driver to ignore part of the register values sent by the timing controller, and it is also unnecessary to compensate for the register values sent by the timing controller through a peripheral circuit, this simplifies the procedure of register value transmission, and increases the flexibility of matching the number of register values at both the receiving end and the sending end.

In an embodiment, the generator 520 may be configured for:

generating an initial instruction including the n register values according to the information setting directive; and encoding the initial instruction adopting an 8b/10b encoding approach to obtain the information setting instruction.

In an embodiment, the initial instruction may further include data bits and/or transmission identification. In an implementation, the data bits and/or the transmission identification may be located ahead of the n register values. The data bits carry display data or link stability check data, the link stability check data is data for detecting a data transmission state of a link between the timing controller and the source driver, and the transmission identification is used for indicating the start of transmission of the n register values.

In an embodiment, the n register values may include a register value of 11 bytes, which may be used for indicating at least one of channel number of a port, scrambling function enabled, matching resistance and transmission rate.

In an embodiment, the n register values may further include a register value of 18 consecutive bytes in addition to the register value of 11 bytes, and the register value of 11 bytes may include binary data of 1 bit for indicating whether the register value of 18 consecutive bytes represents a Gamma voltage value to be adjusted.

In an embodiment, the n register values may further include a register value of 15 consecutive bytes, and the register value of 11 bytes may include binary data of 4 consecutive bits for indicating a number of bytes of the register value for representing user customized configuration data in the register value of 15 consecutive bytes.

In an embodiment, the n register values may further include a register value of 16 consecutive bytes, and the register value of 11 bytes may include binary data of 2 consecutive bits for indicating whether the register value of 16 consecutive bytes represents a user defined register value and a mode of the user defined register value.

In an embodiment, the transmission identification is a K4 code of 4 bytes.

In the above register value transmitter, since the timing controller will generate an information setting instruction including a corresponding number of register values according to a triggered information setting directive and send the information setting instruction to the source driver each time, the source driver may set the configuration information according to the information setting instruction, and as compared to the related art, there is no need for the source driver to ignore part of the register values sent by the timing controller, and it is also unnecessary to compensate for the register values sent by the timing controller through a peripheral circuit, this simplifies the procedure of register value transmission, and increases the flexibility of matching the number of register values at both the receiving end and the sending end.

Figure 6:
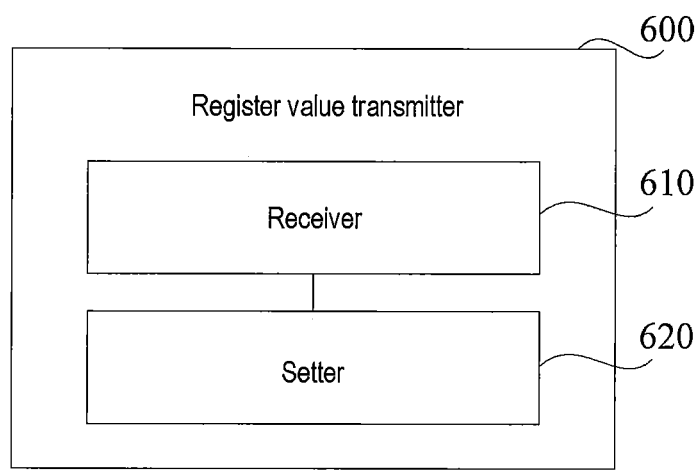
FIG. 6 is a structural schematic diagram of another register value transmitter provided according to an embodiment of the disclosure

FIG. 6 shows another register value transmitter provided according to an embodiment of the disclosure, which register value transmitter may be used for any of the source drivers 200 in the application environment as shown in FIG. 1. As shown in FIG. 6, the register value transmitter 600 may include:

a receiver 610 which may be configured for receiving an information setting instruction sent by a timing controller, the information setting instruction including n register values, the information setting instruction being generated by the timing controller according to a triggered information setting directive including the n register values, the n register values being used for instructing the source driver to set configuration information of the source driver according to the n register values, and n being greater than 1; and a setter 620 which may be configured for setting the configuration information of the source driver according to the n register values.

In the above register value transmitter, the source driver receives an information setting instruction sent by the timing controller, and sets configuration information of the source driver according to n register values, wherein the information setting instruction includes the n register values, the information setting instruction is generated by the timing controller according to a triggered information setting directive including the n register values, the n register values are used for instructing the source driver to set configuration information of the source driver according to the n register values, so there is no need for the source driver to ignore part of the register values sent by the timing controller, it is also unnecessary to compensate for the register values sent by the timing controller through a peripheral circuit, and this simplifies the procedure of register value transmission, and increases the flexibility of matching the number of register values at both the receiving end and the sending end.

In an embodiment, the setter 620 may be configured for:

decoding the information setting instruction adopting an 8b/10b decoding approach to obtain an initial instruction including the n register values; and setting the configuration information of the source driver according to the n register values in the initial instruction.

In an embodiment, the initial instruction further includes data bits and/or transmission identification. In a specific implementation, the data bits and/or the transmission identification may be located ahead of the n register values. The data bits carry display data or link stability check data, the link stability check data is data for detecting a data transmission state of a link between the timing controller and the source driver, and the transmission identification is used for indicating the start of transmission of the n register values.

In an embodiment, the n register values include a register value of 11 bytes, which may include data for indicating the channel number of a port. For example, the register value of 11 bytes may include binary data of 2 consecutive bits for indicating a channel number of a port. Accordingly, the setter 620 may be configured for:

setting the channel number of a port of the source driver to x1 when the binary data of 2 consecutive bits is 00;

setting the channel number of the port of the source driver to x2 when the binary data of 2 consecutive bits is 01; and setting the channel number of the port of the source driver to x3 when the binary data of 2 consecutive bits is 10 or 11, x1, x2 and x3 being mutually different.

In an embodiment, the register value of 11 bytes may further include data for indicating scrambling function enabled. For example, the register value of 11 bytes may include binary data of 1 bit for indicating scrambling function enabled. Accordingly, the setter 620 may be configured for:

disabling the scrambling function when the binary data of 1 bit is 0; and enabling the scrambling function when the binary data of 1 bit is 1.

In an embodiment, the register value of 11 bytes may further include data for indicating matching resistance. For example, the register value of 11 bytes may include binary data of 3 consecutive bits for indicating matching resistance. Accordingly, the setter 620 may be configured for:

setting the matching resistance of the source driver to y1 Ohms when the binary data of 3 consecutive bits is 000;

setting the matching resistance of the source driver to y2 Ohms when the binary data of 3 consecutive bits is 001;

setting the matching resistance of the source driver to y3 Ohms when the binary data of 3 consecutive bits is 010;

setting the matching resistance of the source driver to y4 Ohms when the binary data of 3 consecutive bits is 011;

setting the matching resistance of the source driver to y5 Ohms when the binary data of 3 consecutive bits is 100; and setting the matching resistance of the source driver to y6 Ohms when the binary data of 3 consecutive bits is 101, y1, y2, y3, y4, y5 and y6 being mutually different.

In an embodiment, the register value of 11 bytes may further include data for indicating a transmission rate. For example, the register value of 11 bytes may include binary data of 5 consecutive bits for indicating a transmission rate. Accordingly, the setter 620 may be configured for:

setting the transmission rate of the source driver to 540 Mbps when the binary data of 5 consecutive bits is 00000, and increasing the transmission rate of the source driver by 108 Mbps when 00000 increases by a binary 1 of 1 bit.

In an embodiment, the n register values may further include a register value of 18 consecutive bytes, and the register value of 11 bytes may include binary data of 1 bit for indicating whether the register value of 18 consecutive bytes represents a Gamma voltage value to be adjusted. Accordingly, the setter 620 may be configured for:

determining that the register value of 18 consecutive bytes does not represent a Gamma voltage value to be adjusted when the binary data of 1 bit is 0; and determining that the register value of 18 consecutive bytes represents a Gamma voltage value to be adjusted when the binary data of 1 bit is 1, and adjusting the Gamma voltage according to the Gamma voltage value represented by the register value of 18 consecutive bytes.

In an embodiment, the n register values may further include a register value of 15 consecutive bytes, and the register value of 11 bytes may include binary data of 4 consecutive bits for indicating a number of bytes of the register value for representing user customized configuration data in the register value of 15 consecutive bytes. The setter 620 may be configured for:

determining the number of bytes of the register value for representing user customized configuration data in the register value of 15 consecutive bytes according to the binary data of 4 consecutive bits;

obtaining the user customized configuration data from the register value of 15 consecutive bytes according to the determined number of bytes; and setting the configuration information of the source driver according to the obtained user customized configuration data.

In an embodiment, the n register values may further include a register value of 16 consecutive bytes, and the register value of 11 bytes may include binary data of 2 consecutive bits for indicating whether the register value of 16 consecutive bytes represents a user defined register value and a mode of the user defined register value. Accordingly, the setter 620 may be configured for:

determining that the register value of 16 consecutive bytes does not represent a user defined register value when the binary data of 2 consecutive bits is 00; and determining that the register value of 16 consecutive bytes represents a user defined register value when the binary data of 2 consecutive bits is 01, 10 or 11, and determining a mode of the user defined register value according to the binary data of 2 consecutive bits in the register value of a third byte, and setting the configuration information of the source driver according to the determined mode.

In the register value transmitter described above, the source driver receives an information setting instruction sent by the timing controller, and sets configuration information of the source driver according to n register values, wherein the information setting instruction includes the n register values, the information setting instruction is generated by the timing controller according to a triggered information setting directive including the n register values, the n register values are used for instructing the source driver to set configuration information of the source driver according to the n register values, so there is no need for the source driver to ignore part of the register values sent by the timing controller, it is also unnecessary to compensate for the register values sent by the timing controller through a peripheral circuit, and this simplifies the procedure of register value transmission, and increases the flexibility of matching the number of register values at both the receiving end and the sending end.

According to a further aspect of the disclosure, there is further provided a display device including a timing controller and a source driver, wherein the timing controller may include a register value transmitter as shown in FIG. 5, and the source driver may include a register value transmitter as shown in FIG. 6.

The display device may be any product or component with the display function, such as a liquid crystal panel, an electronic paper, an organic light emitting diode (OLED for short) panel, a mobile phone, a tablet computer, a television (e.g., a liquid crystal television including a backlight brightness control unit), a display, a notebook computer, a digital photo frame, a navigator, etc.

According to a further aspect of the disclosure, there is further provided a computer readable storage medium storing instructions therein which, when executed by a processor, causes the processor to perform a register value transmission method as shown in FIG. 2 or FIG. 4A.

According to a further aspect of the disclosure, there is further provided a computer readable storage medium storing instructions therein which, when executed by a processor, causes the processor to perform a register value transmission method as shown in FIG. 3 or FIG. 4A.

It may be clearly understood by the person having skills in the art that, for convenience and brevity of description, specific working procedures of the devices and modules described above may be referred to corresponding procedures in the above method embodiments, which will not be repeated here any longer.

It may be appreciated that, what are described above are just exemplary embodiments of the invention, however, the protective scope of the invention is not limited thereto. It should be pointed out that, various variations or alternatives may readily occur to the person having ordinary skills in the art, and these variations or alternatives should all be encompassed in the protective scope of the invention, without departing from the spirit and principle of the invention. Therefore, the protective scope of the invention should be subject to the protective scope of the appended claims.

It is noted that, the above embodiments are just illustrated by division of the above various functional modules, and in a practical application, the above functions may be allocated to different functional modules for accomplishment as needed. It may be possible to divide the internal structure of a device into different functional modules to accomplish all or part of the above described functions. In addition, the function of one module described above may be accomplished by multiple modules, and the functions of multiple modules described above may also be integrated into one module for accomplishment.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of computing platforms having a variety of processors.

In this application, wordings such as "first", "second", and "third", etc. are used. When there is no additional context, use of such wordings does not aim at implying ordering, and in fact, they are just used for the purpose of identification. For example, the phrases "first register value" and "second register value" do not necessarily mean that the first register value is located before the second register value in terms of position, or also do not mean that the first register value is generated, received or processed before the second register value in terms of time. In fact, the phrases are just used to identify different register values.

In the claims, any reference sign placed between the parentheses shall not be construed as limiting to a claim. The term "include" does not exclude the presence of an element or a step other than those listed in a claim. The word "a" or "an" preceding an element does not exclude the presence of a plurality of such elements. The invention may be implemented by means of hardware including several distinct elements, or also by suitably programmed software or firmware, or by any combination thereof.

In an apparatus or system claim enumerating several devices, one or more of the devices may be embodied by one and the same hardware item. The mere fact that certain measures are recited in mutually different dependent claims does not indicate that a combination of these measures cannot be used to advantage.

The invention claimed is:

1. A register value transmission method for a timing controller, the method comprising:
   receiving a triggered information setting directive comprising n register values for instructing a source driver to set configuration information of the source driver according to the n register values, n being greater than 1;
   generating an information setting instruction comprising the n register values according to the information setting directive, comprising:
      generating an initial instruction comprising the n register values according to the information setting directive; and
      encoding the initial instruction adopting an 8b/10b encoding approach to obtain the information setting instruction; and
   sending the information setting instruction to the source driver;
   wherein the initial instruction further comprises data bits and/or transmission identification,
   wherein the data bits carry display data or link stability check data,
   wherein the link stability check data is associated with detecting a data transmission state of a link between the timing controller and the source driver, and
   wherein the transmission identification indicates transmission of the n register values,
   wherein the n register values comprise a first register value, and
   wherein the first register value indicates at least one of channel number of a port, scrambling function enabled, matching resistance, or transmission rate.

2. The method as claimed in claim 1,
   wherein the transmission identification is a K4 code of 4 bytes.

3. The method as claimed in claim 1,
   wherein the n register values further comprise a second register value, and
   wherein the first register value comprises data for indicating whether the second register value represents a Gamma voltage value to be adjusted.

4. The method as claimed in claim 1,
   wherein the n register values further comprise a third register value, and
   wherein the first register value comprises a number of bytes of the register value for representing user customized configuration data in the third register value.

5. The method as claimed in claim 1,
   wherein the n register values further comprise a fourth register value, and
   wherein the first register value indicates whether the fourth register value represents a user defined register value and a mode of the user defined register value.

6. A non-transitory computer readable storage medium storing instructions therein, which, when executed by a computer, causes the computer to perform the register value transmission method of claim 1.

7. A register value transmission method for the source driver, the method comprising:
   receiving the information setting instruction sent by the timing controller of claim 1, the information setting instruction comprising the n register values, wherein the information setting instruction is generated by the timing controller according to a triggered information setting directive comprising the n register values, and wherein n is greater than 1;

decoding the information setting instruction adopting an 8b/10b decoding approach to obtain an initial instruction comprising the n register values; and setting configuration information of the source driver according to the n register values in the initial instruction, comprising:

setting at least one of the following: channel number of a port, scrambling function enabled, matching resistance, or transmission rate;

wherein the initial instruction further comprises data bits and/or transmission identification, wherein the data bits carry display data or link stability check data, wherein the link stability check data is associated with detecting a data transmission state of a link between the timing controller and the source driver, and wherein the transmission identification indicates transmission of the n register values.

8. The method as claimed in claim 7, wherein the setting configuration information of the source driver according to the n register values further comprises:

setting at least one of the following: Gamma voltage value, user customized configuration data, user defined register value or mode of user defined register value, wherein the n register values comprise a register value of 11 bytes used for indicating a channel number of a port, and wherein the register value of 11 bytes comprises binary data of 2 consecutive bits, and wherein the setting configuration information of the source driver according to the n register values comprises:

setting the channel number of the port of the source driver to x1 when the binary data of 2 consecutive bits is 00;

setting the channel number of the port of the source driver to x2 when the binary data of 2 consecutive bits is 01; and setting the channel number of the port of the source driver to x3 when the binary data of 2 consecutive bits is 10 or 11, x1, x2 and x3 being mutually different.

9. The method as claimed in claim 8, wherein the register value of 11 bytes is further used for indicating scrambling function enabled, and the register value of 11 bytes comprises binary data of 1 bit, and wherein the setting configuration information of the source driver according to the n register values comprises:

disabling the scrambling function when the binary data of 1 bit is 0; and enabling the scrambling function when the binary data of 1 bit is 1.

10. The method as claimed in claim 9, wherein the register value of 11 bytes is further used for indicating matching resistance, and the register value of 11 bytes comprises binary data of 3 consecutive bits, and wherein the setting configuration information of the source driver according to the n register values comprises:

setting the matching resistance of the source driver to y1 Ohms when the binary data of 3 consecutive bits is 000;

setting the matching resistance of the source driver to y2 Ohms when the binary data of 3 consecutive bits is 001;

setting the matching resistance of the source driver to y3 Ohms when the binary data of 3 consecutive bits is 010;

setting the matching resistance of the source driver to y4 Ohms when the binary data of 3 consecutive bits is 011;

setting the matching resistance of the source driver to y5 Ohms when the binary data of 3 consecutive bits is 100; and setting the matching resistance of the source driver to y6 Ohms when the binary data of 3 consecutive bits is 101, wherein y1, y2, y3, y4, y5 and y6 are mutually different.

11. The method as claimed in claim 10, wherein the register value of 11 bytes is further used for indicating a transmission rate, and the register value of 11 bytes comprises binary data of 5 consecutive bits, and wherein the setting configuration information of the source driver according to the n register values comprises:

setting the transmission rate of the source driver to 540 Mbps when the binary data of 5 consecutive bits is 00000, and increasing the transmission rate of the source driver by 108 Mbps when 00000 increases by a binary 1 of 1 bit.

12. The method as claimed in claim 11, wherein the register value of 11 bytes comprises a register value of a first byte, the n register values further comprise a register value of 18 consecutive bytes in addition to the register value of the first byte, and binary data of 1 bit in the register value of the first byte is used for indicating whether a second register value of 18 consecutive bytes represents a Gamma voltage value to be adjusted, and wherein the setting configuration information of the source driver according to the n register values comprises:

determining that the register value of 18 consecutive bytes does not represent a Gamma voltage value to be adjusted when the binary data of 1 bit in the register value of the first byte is 0; and determining that the register value of 18 consecutive bytes represents a Gamma voltage value to be adjusted when the binary data of 1 bit in the register value of the first byte is 1, and adjusting the Gamma voltage according to the Gamma voltage value represented by the register value of 18 consecutive bytes.

13. The method as claimed in claim 11, wherein the register value of 11 bytes comprises a register value of a second byte, the n register values further comprise a register value of 15 consecutive bytes in addition to the register value of the second byte, and binary data of 4 consecutive bits in the register value of the second byte is used for indicating a number of bytes of the register value for representing user customized configuration data in the register value of 15 consecutive bytes, and wherein the setting configuration information of the source driver according to the n register values comprises:

determining the number of bytes of the register value for representing user customized configuration data in the register value of 15 consecutive bytes according to the binary data of 4 consecutive bits in the second byte;

obtaining the user customized configuration data from the register value of 15 consecutive bytes according to the determined number of bytes; and setting the configuration information of the source driver according to the obtained user customized configuration data.

14. The method as claimed in claim 11, wherein the register value of 11 bytes comprises a register value of a third byte, the n register values further comprise a register value of 16 consecutive bytes in addition to the register value of the third byte, and binary data of 2 consecutive bits in the register value of the third byte is used for indicating whether the register value of 16 consecutive bytes represents a user defined register value and a mode of the user defined register value, and the setting configuration information of the source driver according to the n register values comprises:

determining that the register value of 16 consecutive bytes does not represent a user defined register value when the binary data of 2 consecutive bits in the register value of the third byte is 00; and determining that the register value of 16 consecutive bytes represents a user defined register value when the binary data of 2 consecutive bits in the register value of the third byte is 01, 10 or 11, and determining a mode of the user defined register value according to the binary data of 2 consecutive bits in the register value of the third byte, and setting the configuration information of the source driver according to the determined mode.

15. A register value transmitter for a timing controller, the register value transmitter comprising:

a receiver configured for receiving a triggered information setting directive comprising n register values for instructing a source driver to set configuration information of the source driver according to the n register values, wherein n is greater than 1;

a generator configured for generating an information setting instruction comprising the n register values according to the information setting directive, comprising:

generating an initial instruction comprising the n register values according to the information setting directive; and encoding the initial instruction adopting an 8b/10b encoding approach to obtain the information setting instruction; and a sender configured for sending the information setting instruction to the source driver;

wherein the initial instruction further comprises data bits and/or transmission identification, wherein the data bits carry display data or link stability check data, wherein the link stability check data is associated with detecting a data transmission state of a link between the timing controller and the source driver, and wherein the transmission identification indicates transmission of the n register values, wherein the n register values comprise a first register value, and wherein the first register value indicates at least one of channel number of a port, scrambling function enabled, matching resistance, or transmission rate.

16. A display device comprising the register value transmitter for the timing controller of claim 15 further comprising:

a register value transmitter for a source driver, comprising:

a receiver configured for receiving an information setting instruction sent by the timing controller, the information setting instruction comprising n register values, wherein the information setting instruction is configured to be generated by the timing controller according to a triggered information setting directive comprising the n register values, and n being greater than 1;

a decoder configured for decoding the information setting instruction adopting an 8b/10b decoding approach to obtain an initial instruction comprising the n register values; and a setter configured for setting configuration information of the source driver according to the n register values in the initial instruction, comprising:

setting at least one of the following: channel number of a port, scrambling function enabled, matching resistance, transmission rate;

wherein the initial instruction further comprises data bits and/or transmission identification, wherein the data bits carry display data or link stability check data, wherein the link stability check data is associated with detecting a data transmission state of a link between the timing controller and the source driver, and wherein the transmission identification indicates transmission of the n register values.

17. A register value transmitter for a source driver, the register value transmitter comprising:

a receiver configured for receiving an information setting instruction sent by the timing controller of claim 1, the information setting instruction comprising n register values, the information setting instruction being generated by the timing controller according to a triggered information setting directive comprising the n register values, and n being greater than 1;

a decoder configured for decoding the information setting instruction adopting an 8b/10b decoding approach to obtain an initial instruction comprising the n register values; and a setter configured for setting configuration information of the source driver according to the n register values in the initial instruction, comprising:

setting at least one of the following: channel number of a port, scrambling function enabled, matching resistance, transmission rate;

wherein the initial instruction further comprises data bits and/or transmission identification, wherein the data bits carry display data or link stability check data, wherein the link stability check data is associated with detecting a data transmission state of a link between the timing controller and the source driver, and wherein the transmission identification indicates transmission of the n register values.

* * * * *